(12) United States Patent
Ueda et al.

(10) Patent No.: US 7,728,378 B2
(45) Date of Patent: Jun. 1, 2010

(54) NONVOLATILE SEMICONDUCTOR MEMORY DEVICE, MANUFACTURING METHOD THEREOF AND METHOD OF PROGRAMMING INFORMATION INTO THE MEMORY DEVICE

(75) Inventors: Naoki Ueda, Nara (JP); Yoshimitsu Yamauchi, Nabari (JP)

(73) Assignee: Sharp Kabushiki Kaisha, Osaka (JP)

( * ) Notice: Subject to any disclaimer, the term of this patent is extended or adjusted under 35 U.S.C. 154(b) by 405 days.

(21) Appl. No.: 11/935,945

(22) Filed: Nov. 6, 2007

(65) Prior Publication Data
US 2008/0106948 A1 May 8, 2008

(30) Foreign Application Priority Data
Nov. 7, 2006 (JP) .............................. 2006-301819

(51) Int. Cl.
*H01L 29/76* (2006.01)
*H01L 29/788* (2006.01)
(52) U.S. Cl. .................... 257/320; 257/319; 257/321; 257/E29.129; 257/E29.302
(58) Field of Classification Search ................. 257/319, 257/320, 321, E29.129, E29.302
See application file for complete search history.

(56) References Cited

U.S. PATENT DOCUMENTS

| 4,794,565 | A | | 12/1988 | Wu et al. |
| 5,212,541 | A | | 5/1993 | Bergemont |
| 5,760,437 | A | * | 6/1998 | Shimoji ...................... 257/316 |
| 6,101,128 | A | * | 8/2000 | Yamauchi ............... 365/185.28 |
| 6,265,266 | B1 | | 7/2001 | Dejenfelt et al. |
| 6,949,794 | B2 | * | 9/2005 | Yaegashi .................... 257/326 |
| 7,414,283 | B2 | * | 8/2008 | Tanaka et al. ............... 257/314 |
| 2002/0130314 | A1 | | 9/2002 | Yim et al. |
| 2004/0207003 | A1 | | 10/2004 | Kim et al. |
| 2004/0256658 | A1 | | 12/2004 | Park et al. |
| 2006/0054965 | A1 | | 3/2006 | Kim et al. |

FOREIGN PATENT DOCUMENTS

| JP | 05-152579 | 6/1993 |
| JP | 2002-324860 | 11/2002 |
| JP | 2004-266203 | 9/2004 |
| JP | 2004-320039 | 11/2004 |
| JP | 2005-012227 | 1/2005 |

* cited by examiner

*Primary Examiner*—Ngan Ngo
(74) *Attorney, Agent, or Firm*—Morrison & Foerster LLP

(57) ABSTRACT

A nonvolatile semiconductor memory device capable of improving injection efficiency and simplifying manufacturing process is provided. The device comprises a memory cell having second conductive type of first impurity diffusion area and second impurity diffusion area on a first conductive type of semiconductor substrate, between the first and second impurity diffusion areas, a first laminate section formed by laminating a first insulating film, a charge storage layer, a second insulating film and a first gate electrode in this order from the bottom, and a second laminate section formed by laminating a third insulating film and a second gate electrode in this order from the bottom, wherein an area sandwiched between the first and second laminate sections is the second conductive type of a third impurity diffusion area having impurity density lower than that of the first and second impurity diffusion areas and not higher than $5 \times 10^{12}$ ions/cm$^2$.

15 Claims, 5 Drawing Sheets

NONVOLATILE SEMICONDUCTOR MEMORY DEVICE, MANUFACTURING METHOD THEREOF AND METHOD OF PROGRAMMING INFORMATION INTO THE MEMORY DEVICE

CROSS REFERENCE TO RELATED APPLICATION

This Nonprovisional application claims priority under 35 U.S.C. §119(a) on Patent Application No. 2006-301819 filed in Japan on 7 Nov. 2006 the entire contents of which are hereby incorporated by reference.

BACKGROUND OF THE INVENTION

1. Field of the Invention

The present invention relates to a nonvolatile semiconductor memory device, a manufacturing method thereof and a method of programming information into the memory, in particular, to a nonvolatile semiconductor memory device capable of performing electrical writing and erasure of information, a manufacturing method thereof and a method of programming information into the memory device.

2. Description of the Related Art

A nonvolatile semiconductor memory device which programs information using channel hot electrons and erases information using an FN (Fowler-Nordheim) tunneling current has been conventionally provided (Refer to U.S. Pat. No. 6,265,266 (hereinafter referred to as a known document 1), for example). FIG. 6 is a schematic sectional view of a memory cell of a nonvolatile semiconductor memory device described in the known document 1.

In the nonvolatile semiconductor memory device 90 having a conventional configuration as shown in FIG. 6, second conductive type (hereinafter referred to as an "N-type") of impurity diffusion areas 3, 4, and 91 are formed on a first conductive type of (hereinafter referred to as an "P-type") semiconductor substrate 2. A first insulating film 5 is deposited in the area sandwiched between the impurity diffusion area 91 and the impurity diffusion area 4 on the semiconductor substrate 2. A charge storage layer 6, a third insulating film 7 and a first gate electrode 8 are formed on the first insulating film 5 in this order. On the other hand, a second insulating film 9 is deposited in the area sandwiched between the impurity diffusion area 3 and the impurity diffusion area 91 on the semiconductor substrate 2. A second gate electrode 10 is formed on the second insulating film 9. The impurity diffusion area 91 is described to be in a high-density impurity state having the range of $2 \times 10^{15}$ to $6 \times 10^{15}$ ions/cm$^2$.

With such configuration, the impurity diffusion area 3, the second insulating film 9, the second gate electrode 10 and the impurity diffusion area 91 form one transistor (hereinafter referred to as an "access transistor") 11. The impurity diffusion area 91, the second insulating film 5, the charge storage layer 6, the third insulating film 7, the first gate electrode 8 and the impurity diffusion area 4 form another transistor (hereinafter referred to as a "memory cell transistor") 12. The access transistor 11 is serially connected to the memory cell transistor 12 via the impurity diffusion area 91. The impurity diffusion area 4 is connected to a drain bit line and the impurity diffusion area 3 is connected to a source bit line.

An example of a method of driving the nonvolatile semiconductor memory device 90 thus constituted will be described. In an example of a programming method, a predetermined positive voltage is applied to the first gate electrode 8, the second gate electrode 10 and the impurity diffusion area 4 as a drain of a selected memory cell respectively, and the impurity diffusion area 3 as a source is connected to a ground voltage. At this time, a channel area is formed in each of portions under the first gate electrode 8 and the second gate electrode 10 on the semiconductor substrate 2. Thus, the access transistor 11 and the memory cell transistor 12 are put into a conductive state. At this time, since a pinch-off point where channel disappears occurs in the vicinity of the drain of the impurity diffusion area 91 and electrons drift through the point, a high electrical field is generated in the area near the drain due to a high potential difference between channel potential and drain potential. Since a positive voltage is applied to the first gate electrode 8, channel hot electrons are drawn toward the first gate electrode 8 and taken into the charge storage layer 6 so that information may be programmed. As described above, since it is necessary to concentrate the high potential difference on the portion near the drain and prevent voltage drop in the other areas as much as possible, the impurity density in the impurity diffusion area 91 must be high.

In an example of an erasing method, the impurity diffusion area 3 is opened and a predetermined negative voltage is applied to the second gate electrode 10 and the first gate electrode 8. A predetermined positive voltage is applied to the impurity diffusion area 4. As a result, a high potential difference occurs between the first gate electrode 8 and the impurity diffusion area 4, thereby generating a high electrical field between them. The high electrical field generates a current (FN current) tunneling through the first insulating film 5 to pull out the electrons held in the charge storage layer 6 toward the impurity diffusion area 4. Thus, stored information is erased.

In an example of a reading method, by applying a positive voltage to the impurity diffusion area 4, the first gate electrode 8 and the second gate electrode 10 and grounding the impurity diffusion area 3, current amount passing through the source line is detected. When information is stored in the memory cell transistor 12, electrons are held in the charge storage layer 6. Thus, compared with an initial state (no electrons are held in the charge storage layer 6, that is, no information is stored), a threshold voltage of the memory cell transistor 12 rises. In other words, since the current amount passing through the selected memory cell transistor 12 varies depending on whether information is stored in the memory cell transistor 12 or not, it is possible to determine whether information is programmed into the memory cell or not by detecting the current amount from the source line.

However, according to the nonvolatile semiconductor memory device described in the known document 1, information is programmed by injecting channel hot electrons. Thus, in programming, the current amount of 100 μA or more per memory cell and high voltage applied to the impurity diffusion area 4 serving as the drain are required. This is because it is necessary to give enough energy to cross an energy barrier of the first insulating film 5 to the electrons by forming a pinch-off area in the vicinity of impurity diffusion area 4 to constitute a high electrical field state and thus increasing the speed of electrons moving in the channel within the high electrical field in the pinch-off area. However, according to this method, energy necessary for crossing the energy barrier of the first insulating film 5 is given to the electrons, resulting in that excessive energy is given to the electrons with high voltage between the drain and the source. For this reason, the above-mentioned large current amount is needed. As a result, disadvantageously, injection efficiency becomes low.

In consideration with this, a nonvolatile semiconductor device capable of improving injection efficiency by adding a certain characteristic to configuration has been conventionally provided (Refer to, for example, Japanese Patent No. 2862434 (hereinafter referred to as a known document 2) and U.S. Pat. No. 5,212,541 (hereinafter referred to as a known document 3).

FIGS. 7A and 7B are schematic sectional views of a memory cell of a nonvolatile semiconductor memory device having conventional configuration described in the known document 2 and the known document 3. FIG. 7A shows the memory cell described in the known document 2 and FIG. 7B shows the memory cell described in the known document 3.

As shown in FIG. 7A, in a memory cell 94 having conventional configuration described in the known document 2, the second gate electrode 10 and the charge storage layer 6 in the form of a side spacer are formed between the impurity diffusion area 4 as a drain and the impurity diffusion area 3 as a source. A first gate electrode 8 is formed so as to cover these elements.

As shown in FIG. 7B, in a memory cell 95 having conventional configuration described in the known document 3, a part of the second gate electrode 10 extends above the first gate electrode 8 between the impurity diffusion area 4 as a drain and the impurity diffusion area 3 as a source. Thus, the gate electrodes in the area constitute a two-layer structure in which the first gate electrode 8 is situated next to a part of the second gate electrode 10 on the side wall of the first gate electrode 8 via an insulating film.

With such configuration as shown in FIG. 7A or 7B, in a state where a positive voltage is applied to the impurity diffusion area 4 as the drain and the impurity diffusion area 3 as the source is connected to a ground voltage, a positive voltage is applied to the second gate electrode 10 and the first gate electrode 8 in this order. A channel formed in an area under the second gate electrode 10 is put into a weak inversion state by applying the positive voltage to the second gate electrode 10 and a channel formed in an area under the first gate electrode 8 is put into a strong inversion state by applying the positive voltage to the first gate electrode 8. Since a high electrical field occurs in the vicinity of these boundaries, electrons fed from the side of the source (impurity diffusion area 3) are excited in this high electrical field and injected to the charge storage layer 6 from the source, thereby programming information (source-side injection). As compared with the method described in the known document 1, this method enables injection efficiency to be improved by about one digit.

However, in both the configurations described in the known document 2 and the known document 3, as shown in FIG. 7A or 7B, disadvantageously, two-layer gate materials are deposited so that the first gate electrode 8 may be situated next to a part of the second gate electrode 10 on the side wall of the first gate electrode 8 via an insulating film, resulting in a complicated manufacturing process. When the first and second gate electrodes are formed on the same layer to simplify the manufacturing process, the distance between the first and second gate electrodes becomes too large. Thus, it becomes difficult to control the inversion state of the surface of the first conductive type of semiconductor substrate in the area between the gate electrodes. As a result, since minority carrier density is greatly lowered, the current necessary for programming cannot be disadvantageously ensured.

SUMMARY OF THE INVENTION

In consideration with such problem, an object of the present invention is to provide a nonvolatile semiconductor memory device which can achieve charge injection by source-side injection with high injection efficiency and can be manufactured by a simple manufacturing process.

To attain the above-mentioned object, the nonvolatile semiconductor memory device according to the present invention is characterized, as a first feature, by comprising a memory cell having second conductive type of first impurity diffusion area and second impurity diffusion area formed on a first conductive type of semiconductor substrate, a first laminate section formed by laminating a first insulating film, a charge storage layer, a second insulating film and a first gate electrode in this order from the bottom and a second laminate section formed by laminating a third insulating film and a second gate electrode in this order from the bottom, between the first and second impurity diffusion areas, wherein an area sandwiched between the first laminate section and the second laminate section is a third impurity diffusion area having the second conductive type of impurity density which is lower than that of the first and second impurity diffusion areas and not higher than $5 \times 10^{12}$ ions/cm².

According to the first feature of the nonvolatile semiconductor memory device of the present invention, since the second conductive type of impurity density in the third impurity diffusion area is set to be lower than that in the first and second impurity diffusion areas, in the programming action when a potential difference occurs between the first impurity diffusion area and the second impurity diffusion area, when carriers in the second impurity diffusion area move in the channel area toward the first impurity diffusion area, the moving speed lowers in the third impurity diffusion area, and the current flow is limited in the area. Thus, the potential difference between the first impurity diffusion area and the second impurity diffusion area substantially concentrates in the third impurity diffusion area and the area is put into the high electrical field state (a high electrical field is generated in the horizontal direction). Accordingly, the carriers move in the third impurity diffusion area and are excited due to the high electrical field, increasing the energy, and become hot carriers in the vicinity of the first laminate section. At this time, by applying the voltage having the opposite polarity to the carriers to the first gate electrode, the hot carriers are taken from the third impurity diffusion area in the vicinity of the first laminate section through the energy barrier of the first insulating film into the charge storage layer, so that information may be held. That is, by bringing the third impurity diffusion area into the low density state, source-side injection can be achieved without arranging the gate material so that a part of the gate electrode may have two-layer structure as conventional. As a result, compared with the conventional configuration, the manufacturing process is simplified. Furthermore, compared with the conventional configuration in which channel hot electrons are injected into the charge storage layer, the current flowing through the memory cell is limited, thereby improving the injection efficiency of hot electrons. Especially, a maximum value of the current generated when electrons are trapped from the third impurity diffusion area into the charge storage layer under standard manufacturing conditions can be made larger. In other words, since more electrons can be trapped from the third impurity diffusion area into the charge storage layer per unit time, information can be correctly programmed into the memory cell.

Especially, by setting the second conductive type of impurity density in the third impurity diffusion area to $5 \times 10^{12}$ ions/cm$^2$ or less, a maximum value of the current generated when electrons are trapped from the third impurity diffusion area into the charge storage layer under standard manufacturing conditions can be made larger. In other words, since more electrons can be trapped from the third impurity diffusion area into the charge storage layer per unit time, information can be correctly programmed into the memory cell.

In addition to the above-mentioned first feature, the nonvolatile semiconductor memory device of the present invention has a second feature that no gate electrode is placed above the third impurity diffusion area.

According to the second feature of the nonvolatile semiconductor memory device of the present invention, due to simplified structure, the memory can be manufactured by using a smaller number of steps. The above-mentioned "gate electrode" with this structure includes the first gate electrode and the second gate electrode.

In addition to the above-mentioned first or second feature, the nonvolatile semiconductor memory device of the present invention has a third feature that in a first state where several predetermined programming voltages are applied to the first impurity diffusion area, the second impurity diffusion area, the first gate electrode and the second gate electrode respectively, a high electrical field state is formed in the third impurity diffusion area and charge injection from the third impurity diffusion area into the charge storage layer by source-side injection of hot carriers allows information to be programmed.

In addition to the third feature, the nonvolatile semiconductor memory device of the present invention has a fourth feature that a channel of a portion under the second laminate section turns into a weak inversion state in the first state.

According to the above-mentioned third feature of the nonvolatile semiconductor memory device of the present invention, since the weak inversion state is formed in the region under the second laminate section, the electric potential at a contact portion between the region under the second laminate section and the third impurity diffusion area gets closer to the electric potential of the second impurity diffusion area and the potential difference generated between the first impurity diffusion area and the second impurity diffusion area concentrates in the third impurity diffusion area in the first state. Thus, a high electrical field can be formed in the area, thereby effectively generating the hot carriers in the area.

In addition to one of the above-mentioned first to fourth features, the nonvolatile semiconductor memory device of the present invention has a fifth feature that the impurity density in the first and second impurity diffusion areas is not lower than $1 \times 10^{15}$ ions/cm$^2$.

According to the above-mentioned fifth feature of the nonvolatile semiconductor memory device of the present invention, since large difference between the impurity density in the third impurity diffusion area and the impurity density in the first and second impurity diffusion area occurs, the effect obtained by generating the high electrical field in the third impurity diffusion area can be acquired.

In addition to one of the above-mentioned first to fifth features, the nonvolatile semiconductor memory device of the present invention has a sixth feature that the second insulating film and the third insulating film are made of the same insulative material.

According to the above-mentioned sixth feature of the nonvolatile semiconductor memory device of the present invention, the second insulating film and the third insulating film can be formed in the same step and the manufacturing process of the nonvolatile semiconductor memory device of the present invention can be cut down.

In addition to one of the above-mentioned first to sixth features, the nonvolatile semiconductor memory device of the present invention has a seventh feature that the first gate electrode and the second gate electrode are made of the same conductive material.

According to the above-mentioned seventh feature of the nonvolatile semiconductor memory device of the present invention, the first gate electrode and the second gate electrode can be formed in the same step and the manufacturing process of the nonvolatile semiconductor memory device of the present invention can be cut down.

In addition to one of the above-mentioned first to seventh features, the nonvolatile semiconductor memory device of the present invention is characterized, as an eighth feature, by comprising a memory cell array formed by arranging a plurality of memory cells in the row and column directions and a transistor having the same insulative material as the second insulating film, the same conductive material as the first gate electrode and the second conductive type of impurity diffusion area, in a peripheral circuit area other than an area where the memory cell array is formed.

According to the above-mentioned eighth feature of the nonvolatile semiconductor memory device of the present invention, through the memory cell forming step, the transistor in the peripheral circuit area can be simultaneously formed and the manufacturing process of the nonvolatile semiconductor memory device of the present invention can be cut down.

To attain he above-mentioned object, the manufacturing method of the nonvolatile semiconductor memory device of the present invention as stated in claim 1 is characterized, as a first feature, by comprising a first step of forming the first insulating film and the charge storage layer in an area where the first laminate section will be formed, a second step of sequentially depositing the insulative material and the conductive material after the first step, and forming the first laminate section and the second laminate section by removing both the materials deposited on the area other than a predetermined area, a third step of injecting the second conductive type of impurity into the third impurity diffusion area so that the impurity density may be not higher than $5 \times 10^{12}$ ions/cm$^2$ after the second step and a fourth step of injecting the second conductive type of impurity into the area including the first impurity diffusion area and the second impurity diffusion area so that the impurity density may become a predetermined density higher than $5 \times 10^{12}$ ions/cm$^2$.

In addition to the above-mentioned first feature, the manufacturing method of the nonvolatile semiconductor memory device of the present invention has a second feature that the impurity is injected in the third step and the fourth step using the conductive material forming the first laminate section or the second laminate section as a mask.

In addition to the above-mentioned first or second feature, the manufacturing method of the nonvolatile semiconductor memory device of the present invention has a third feature that the density of the impurity injected in the fourth step is not lower than $1 \times 10^{15}$ ions/cm$^2$.

In addition to one of the above-mentioned first to third features, the manufacturing method of the nonvolatile semiconductor memory device of the present invention has a fourth feature that a control gate electrode of a memory cell transistor for storing information is made of the conductive material of the first laminate section and a gate electrode of an access transistor for controlling electrical conduction to the memory cell transistor is made of the conductive material of the second laminate section.

In addition to one of the above-mentioned first to fourth features, the manufacturing method of the nonvolatile semiconductor memory device of the present invention is characterized, as a fifth feature, by comprising a step of forming a general-purpose logical circuit on the semiconductor substrate using the conductive material deposited in the second step.

In addition to one of the above-mentioned first to fifth features, the manufacturing method of the nonvolatile semiconductor memory device of the present invention has a sixth feature that the second step includes depositing the insulative material and the conductive material in a first predetermined area in a peripheral circuit area other than an area where a memory cell array is formed by arranging a plurality of memory cells in the row and column directions, and the fourth step includes injecting the second conductive type of impurity into a second predetermined area in the peripheral circuit area to form the impurity diffusion area, so that a transistor having the insulative material, the conductive material and the impurity diffusion area is formed in the peripheral circuit area.

To attain the above-mentioned object, an information programming method using the nonvolatile semiconductor memory device of the present invention is a method of programming information into the nonvolatile semiconductor memory device as stated in claim 1 by applying several predetermined programming voltages to the first impurity diffusion area, the second impurity diffusion area, the first gate electrode and the second gate electrode, respectively, wherein a voltage applied to the second gate electrode is close to a threshold voltage of the channel of the portion under the second laminate section.

Compared with the conventional configuration, the configuration of the present invention can improve the injection efficiency and simplify the manufacturing process.

DETAILED DESCRIPTION OF THE INVENTION

Hereinafter, an embodiment of a nonvolatile semiconductor memory device according to the present invention hereinafter referred to as a "device according to the present invention") and a manufacturing method (hereinafter referred to as "this manufacturing method") will be described with reference to figures. First, an example of overall configuration of the device according to the present invention will be described. Then, configuration of a memory cell area as a characterizing part of the device according to the present invention will be described.

The Device According to the Present Invention

Figure 1:
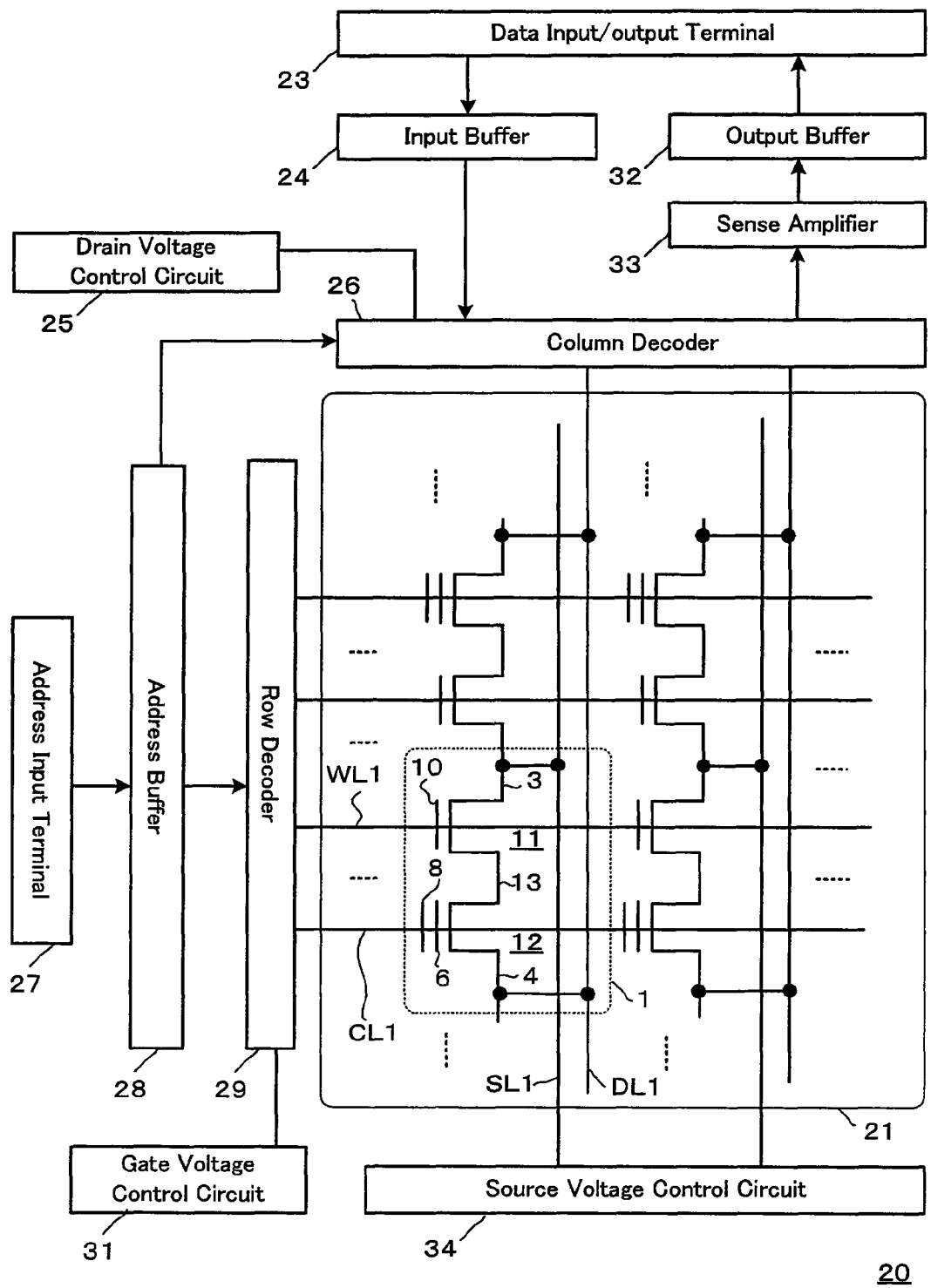
FIG. 1 is a block diagram showing schematic overall configuration of an EEPROM as an example of a device according to the present invention.

FIG. 1 is a block diagram showing schematic overall configuration of an EEPROM as an example of a device according to the present invention. The device 20 according to the present invention shown in FIG. 1 has a memory cell array 21 formed by arranging a plurality of memory cells in a matrix, a data input/output terminal 23, an input buffer 24, a drain voltage control circuit 25, a column decoder 26, an address input terminal 27, an address buffer 28, a row decoder 29, a gate voltage control circuit 31, an output buffer 32, a sense amplifier 33, a source voltage control circuit 34 and a control means (not shown) for controlling each of the control circuits and the buffers.

The memory cell array 21 is formed by arranging a plurality of electrically writable memory cells in the row direction and column direction. Each memory cell has an access transistor for cell selection and a memory cell transistor for information storage.

In the memory cells on the same row, gate electrodes of the memory cell transistors (hereinafter referred to as "first gate electrodes") are connected to a same control line and gate electrodes (hereinafter referred to as "second gate electrodes") of the access transistors are connected to a same word line. In the memory cells on the same column, a same drain bit line is connected to drain areas of the memory cell transistors and a same source bit line is connected to source areas of the access transistors.

The drain voltage control circuit 25 controls voltage of each drain bit line, the gate voltage control circuit 31 controls voltage of each word line and each control line and the source voltage control circuit 34 controls voltage of each source line.

When receiving an address signal input from the address input terminal 27, the address buffer 28 divides the received address signal into a column address and a row address and inputs the addresses into the column decoder 26 and the row decoder 29, respectively. The column decoder 26 selects the drain bit line corresponding to the input column address and the row decoder 29 selects the word line and the control line which correspond to the input row address. Then, data input from the data input/output terminal 23 is programmed into the memory cell selected by the column decoder 26 and the row decoder 29 via the input buffer 24. Alternatively, information programmed into the memory cell selected by the column decoder 26 and the row decoder 29 is read and amplified by the sense amplifier 33, and then, output to the data input/output terminal 23 via the output buffer 32.

Noting a memory cell 1 in the memory cell array 21, the memory cell 1 has the access transistor 11 and the memory cell transistor 12. The source area 3 of the access transistor 11 is connected to the source bit line SL1 and the second gate electrode 10 is connected to the word line WL1. The drain area of the access transistor 11 is electrically connected to the source area of the memory cell transistor 12 (the area 13), the drain area 4 of the memory cell transistor 12 is connected to the drain bit line DL1 and the first gate electrode 8 is connected to the control line CL1.

Figure 2:
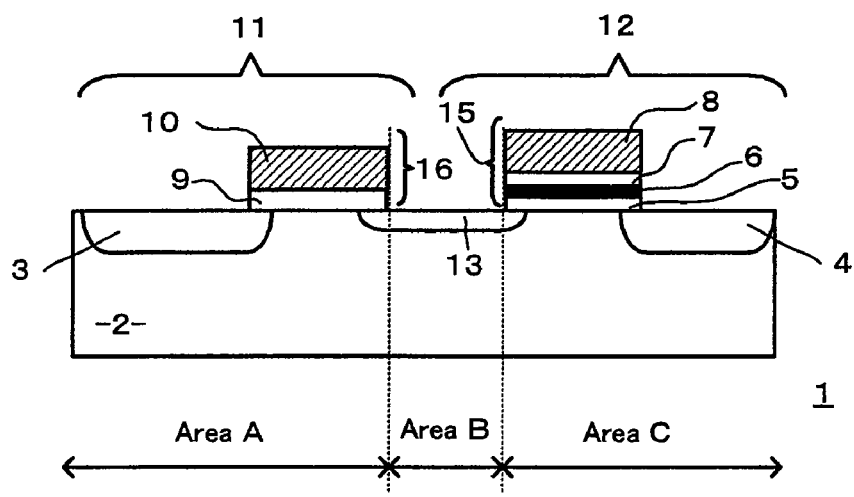
FIG. 2 is a schematic sectional configuration view showing a memory cell of an EEPROM as an example of the device according to the present invention.
Figure 6:
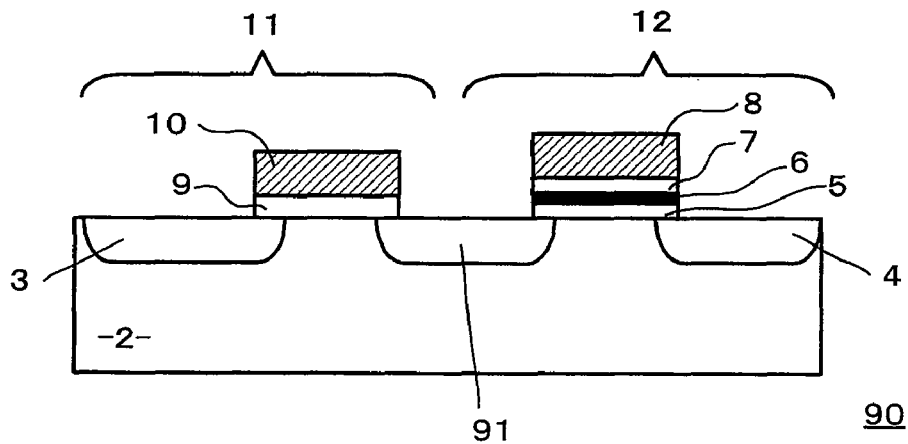
FIG. 6 is a schematic sectional view of a memory cell of a nonvolatile semiconductor memory device having conventional configuration.

FIG. 2 is a schematic sectional configuration view of the memory cell 1. The schematic sectional configuration shown in FIG. 2 is schematically shown and actual configuration does not necessarily correspond to scaled-down configuration in the figure. For simplification, the same reference numerals are given to the same parts as those in FIG. 6.

In the memory cell 1 shown in FIG. 2, the memory cell transistor 12 and the access transistor 11 are formed on the P-type silicon semiconductor substrate 2 in which an element isolation area and a well are formed.

The memory cell transistor 12 has a structure in which the first insulating film 5 having a thickness of 2 to 10 nm, the charge storage layer 6 having a thickness of 2 to 5 nm, the second insulating film 7 having a thickness of 2 to 10 nm and the first gate electrode 8 are stacked in this order from the bottom (this laminate structure is hereinafter referred to as a "first laminate section 15"). For example, a silicon oxide film can be used as the first insulating film 5 and the second insulating film 7. For example, a silicon nitride film can be used as the charge storage layer 6. Any material having higher relative dielectric constant and trap density than the silicon oxide film may be used. For example, a two-layer structure of polysilicon into which an N-type impurity is introduced and high-melting metal (such as tungsten) can be used as the first gate electrode 8.

An N-type impurity diffusion area (hereinafter referred to as a "first impurity diffusion area") 4 having the impurity density of $1 \times 10^{15}$ ions/cm$^2$ or higher and an N-type impurity diffusion area (hereinafter referred to as a "third impurity diffusion area") 13 having the impurity density of $5 \times 10^{12}$ ions/cm$^2$ or lower are formed on the semiconductor substrate 2 so as to place the first laminate section 15 therebetween. As shown in FIG. 1, the first impurity diffusion area 4 is connected to the drain bit line DL1.

On the other hand, the access transistor 11 has a structure in which the third insulating film 9 having a thickness of 2 to 20 nm and the second gate electrode 10 are stacked in this order from the bottom (this laminate structure is hereinafter referred to as a "second laminate section 16"). For example, a silicon oxide film can be used as the third insulating film 9. The third insulating film 9 and a gate insulating film of an MOS transistor in a peripheral circuit area formed in the periphery of the memory cell array 21 may be formed simultaneously. A threshold voltage of the access transistor 11 is set to be a value which is lower than a power supply voltage Vcc in the peripheral circuit area and sufficiently higher than 0 V, for example, a value which falls within the range of 0.5 V to 2 V. Here, the power supply voltage Vcc is set to about 3.3 V and the thickness of the third insulating film 9 is set to 7 nm.

An N-type impurity diffusion area having the impurity density of $1 \times 10^{15}$ ions/cm$^2$ or higher (hereinafter referred to as a "second impurity diffusion area") 3 and the third impurity diffusion area 13 are formed on the semiconductor substrate 2 so as to place the above-mentioned second laminate section 16 therebetween. As shown in FIG. 1, the second impurity diffusion area 3 is connected to the source bit line SL1.

That is, in the memory cell 1, the first impurity diffusion area 4 and the second impurity diffusion area 3 as N-type impurity diffusion areas are formed on the P-type semiconductor substrate 2, and the first laminate section 15, the second laminate section 16 and the third impurity diffusion area 13 are formed between the first impurity diffusion area 4 and the second impurity diffusion area 3. The first laminate section 15 is adjacent to the first impurity diffusion area 4, the second laminate section 16 is adjacent to the second impurity diffusion area 3, and the third impurity diffusion area 13 is formed in an area sandwiched between the first laminate section 15 and the second laminate section 16.

It is assumed that, in the memory cell 1 thus configured, a predetermined positive electric potential is applied to each of the drain bit line DL1 connected to the first impurity diffusion area 4, the control line CL1 connected to the first gate electrode 8 and the word line WL1 connected to the second gate electrode 10, and a ground voltage is applied to the source bit line SL1 connected to the second impurity diffusion area 3. In this embodiment, voltages applied to the drain bit line DL1, the control line CL1 and the word line WL1 are set to about 4 V, 8 to 12 V and 1 to 2 V, respectively (such voltage application state is hereinafter referred to as a "first state").

When the voltage is applied in this manner, a channel area is formed in each of a region under the second laminate section 16 and a region under the first laminate section 15 on the semiconductor substrate 2. Thus, the second impurity diffusion area 3, the third impurity diffusion area 13 and the first impurity diffusion area 4 can be electrically connected to each other. That is, electrons in the second impurity diffusion area 3 is drawn toward the first laminate section 15 by the positive voltage applied to the first impurity diffusion area 4 through the channel area formed in the region under the second laminate section 16 and the third impurity diffusion area 13.

As described above, the impurity density in the third impurity diffusion area 13 is set to a low value of $5 \times 10^{12}$ ions/cm$^2$ or lower. For this reason, the electrons in the second impurity diffusion area 3 drift when moving through the third impurity diffusion area 13 and thus, moving speed lowers in the area. In other words, the speed of a current is controlled in the third impurity diffusion area 13. As a result, the potential difference between the first impurity diffusion area 4 and the second impurity diffusion area 3 substantially concentrates in the third impurity diffusion area 13 and the area is put into the high electrical field state (a high electrical field occurs in the horizontal direction). Furthermore, by controlling the second gate electrode 10 so as to bring the region under the second laminate section 16 into the weak inversion state, the electrical potential at a contact part between the region under the second laminate section 16 and the third impurity diffusion area 13 can be made closer to the ground potential, thereby making the potential difference in the third impurity diffusion area 13 larger. That is, the electric field in the third impurity diffusion area needs to be made higher.

Figure 3:
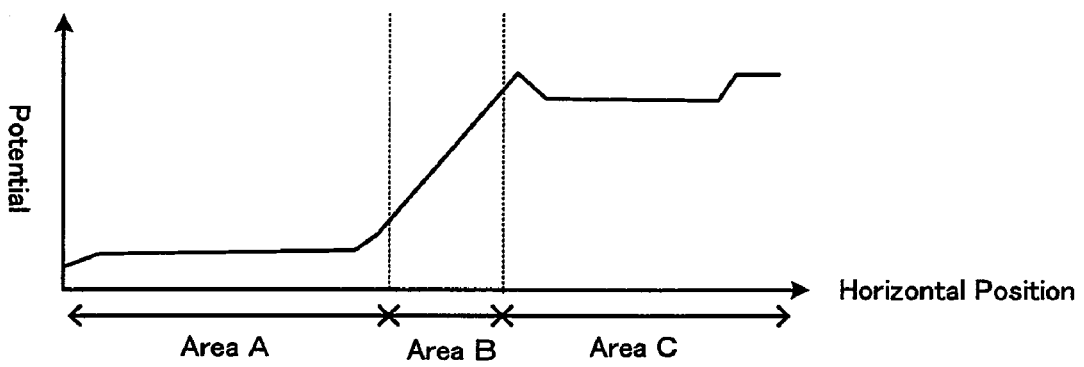
FIG. 3 is a graph showing shift of potential with respect to horizontal location in a channel area formed on a semiconductor substrate in a predetermined voltage application state.
Figure 4:
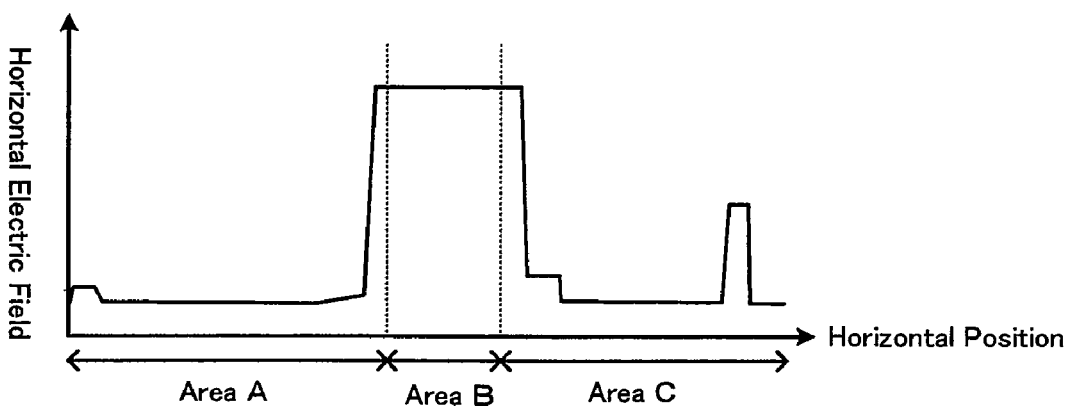
FIG. 4 is a graph showing shift of magnitude of horizontal electric field with respect to horizontal location in the channel area formed on the semiconductor substrate in a predetermined voltage application state.

FIG. 3 is a graph schematically showing shift of potential with respect to the horizontal location in the channel area formed on the semiconductor substrate 2 in the first state. FIG. 4 is a graph schematically showing shift of magnitude of horizontal electric field with respect to horizontal location in the channel area formed on the semiconductor substrate 2 in the first state. In FIG. 3 and FIG. 4, a channel area according to the second impurity diffusion area 3 and the area under the second laminate section 16 on the semiconductor substrate 2 is described as an area A, the third impurity diffusion area 13 is described as an area B and the channel area according to the area under the first laminate section 15 and the first impurity diffusion area 4 is described as an area C (this is shown in FIG. 2).

As described above, due to limitation of the current flowing through the memory cell area and high potential difference in the third impurity diffusion area 13, the area (area B) is put into the high electrical field state (Refer to FIG. 4). Since electrons in the second impurity diffusion area 3 moves in the area B, the electrons are excited due to the high electrical field and the potential rises (Refer to FIG. 3). The electrons with risen potential become hot electrons in the vicinity of the first laminate section 15 in the third impurity diffusion area 13. At this time, since the positive voltage is applied to the first gate electrode 8 in the first state as mentioned above, the hot electrons are drawn toward the first gate electrode 8 and taken into the charge storage layer 6, so that information is programmed. That is, with such memory cell structure as shown in FIG. 2, information can be programmed into the selected memory cell 1 in the voltage application state such as the first state.

When the impurity density in the third impurity diffusion area 13 is high, the potential difference between both ends of the area B in FIG. 3 decreases. As a result, high potential near the boundary between the area B and the area C in FIG. 3 extends to the neighborhood of the boundary between the area B and the area A and a peak of the electric field also moves to the neighborhood of the boundary between the area B and the area A. In this case, since the place where hot carriers occur due to the high electrical field is away from the first laminate section 15 having the charge holding layer, injection probability of hot carriers into the first laminate section 15 lowers and a maximum value of a current generated when electrons are trapped from the third impurity diffusion area 13 into the charge storage layer 6 (hereinafter referred to as "maximum gate current") also lowers. To ensure the maximum gate current, preferably, the density of the third impurity diffusion area 13 is sufficiently low in the above-mentioned range.

When the voltage of the second gate electrode 10 is high, the channel of the access transistor 11 is put into the strong inversion state and the electric potential of the channel of the access transistor in the area A in FIG. 3 rises due to the high gate voltage. Thus, the electric potential of the neighborhood of the boundary between the area B and the area A rises. For this reason, the potential difference between both ends of the third impurity diffusion area 13 (area B) decreases and magnitude of the peak electric field in the area B also lowers. As a result, generation probability of hot carriers lowers and the maximum gate current also lowers. Thus, it is preferable that the channel of the access transistor 11 is in the weak inversion state. In a state where no inversion layer is formed in the channel, the access transistor is in OFF state and a drain current necessary for programming does not flow. Accordingly, hot carriers cannot be generated.

As described above, in the first state, it is preferred that the density in the third impurity diffusion area 13 is sufficiently low in the above-mentioned range, the voltage of the second gate electrode 10 is close to the threshold voltage and the channel of the access transistor 11 is in the weak inversion state.

Figure 5:
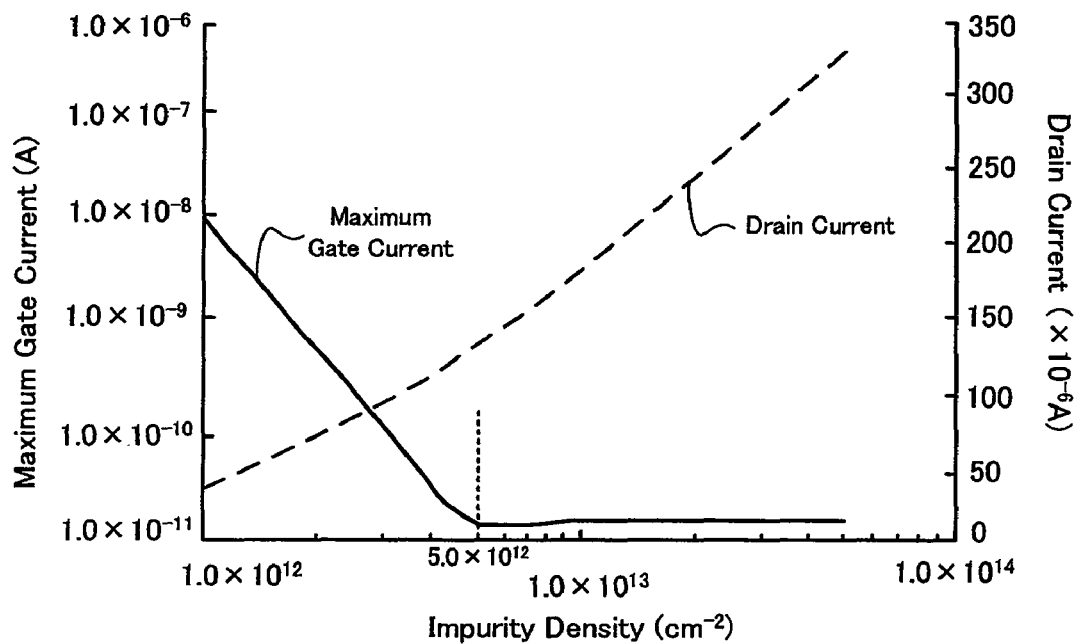
FIG. 5 is a graph showing relationship between the impurity density of a third impurity diffusion area, a maximum value of a current generated when electrons are trapped from the third impurity diffusion area into a charge storage layer, and a drain current of a selected memory cell.

FIG. 5 is a graph showing relationship between the impurity density in the third impurity diffusion area 13, the maximum gate current and the current flowing through the first impurity diffusion area 4 (drain diffusion area) of the selected memory cell 1 (hereinafter referred to as "drain current"). In FIG. 5, a horizontal axis represents the impurity density, a left vertical axis represents the maximum gate current and a right vertical axis represents the drain current.

As the maximum gate current is greater, more electrons are trapped from the third impurity diffusion area 13 into the charge storage layer 6 per unit time. Conversely speaking, when the gate current is smaller than a predetermined value, the amount of electrons trapped from the third impurity diffusion area 13 into the charge storage layer 6 per unit time is small. For this reason, information cannot be possibly programmed into the selected memory cell correctly. Accordingly, in order to program information into the selected memory cell correctly, the maximum gate current needs to be the predetermined value or more. FIG. 5 shows that the maximum gate current greatly rises in the range of the impurity density of $5 \times 10^{12}/cm^2$ or less. This means that the gate current due to channel hot electrons generated in the neighborhood of the first impurity diffusion area 4 of the selected memory cell 1 is predominant in the range where the impurity density is more than $5 \times 10^{12}/cm^2$ and the gate current due to hot electrons generated in the neighborhood of the third impurity diffusion area 13 according to the above-mentioned effect is predominant in the range of the impurity density of $5 \times 10^{12}/cm^2$ or less. As described above, as the impurity density lowers, irrespective of rising of the gate current, the drain current of the selected memory cell 1 lowers due to limitation of the current in the third impurity diffusion area 13.

As described above, to provide enough low electron concentration to ensure voltage drop and electric field concentration in the area B in FIG. 3, the third impurity diffusion area 13 needs to have the above-mentioned impurity density range of $5 \times 10^{12}/cm^2$ or less. The density in the third impurity diffusion area 13 needs to be enough high to ensure the drain current in programming while satisfying the above-mentioned range.

That is, by setting the impurity density in the third impurity diffusion area 13 in the range of $5 \times 10^{12}/cm^2$ or less, the maximum gate current becomes the predetermined value or more in the first state. Thus, a sufficient amount of electrons are trapped from the third impurity diffusion area 13 into the charge storage layer 6 and information is correctly programmed into the memory cell transistor 12. Furthermore, since the drain current greatly lowers in the above-mentioned impurity density range, the ratio of the maximum gate current to the drain current as current consumption, that is, the injection efficiency of hot electrons to the gate is greatly improved.

In the memory cell 1 shown in FIG. 1 and FIG. 2, the source bit line SL1 connected to the second impurity diffusion area 3 is opened, a predetermined negative voltage (for example, −5 V) is applied to the word line WL1 connected to the second gate electrode 10 and the control line CL1 connected to the first gate electrode 8 and a predetermined positive voltage (for example, 5 V) is applied to the drain bit line DL1 connected to the first impurity diffusion area 4 (such voltage application state is hereinafter referred to as a "second state"). This generates high potential difference between the first gate electrode 8 and the first impurity diffusion area 4, thereby generating a high electrical field therebetween. A current (FN current) tunneling through the first insulating film 5 is generated by the high electrical field and electrons held in the charge storage layer 6 are drawn toward the impurity diffusion area 4. Alternatively, hot holes excited by a band-to-band tunnel current which occurs at the overlap portion between the first impurity diffusion area 4 and the first gate electrode 8 are injected into the charge storage layer 6 to offset the electrons held in the charge storage layer 8. That is, with such memory cell structure as shown in FIG. 2, the information stored in the selected memory cell 1 is erased by setting the voltage application state to the second state.

For example, by associating the programming state and the erasure state of the memory cell with data "0" and "1", respectively, 1-bit data (0/1) can be written through the above-mentioned programming and erasure repeatedly. Furthermore, in the memory cell 1 shown in FIG. 1 and FIG. 2, a predetermined positive voltage is applied to the drain bit line DL1 connected to the first impurity diffusion area 4, the control line CL1 connected to the first gate electrode 8 and the word line WL1 connected to the second gate electrode 10 and the source bit line SL1 connected to the second impurity diffusion area 3 is grounded. Unlike the case in the first state, the voltage applied to the drain bit line DL1 is set to about 1 V, the voltage applied to the control line CL1 is set to about 3 V and the voltage applied to the word line WL1 is set to about 3 V (such voltage application state is hereinafter referred to as a "third state"). In the state, the amount of the current flowing through the source bit line SL1 is detected to determine presence or absence of information in the memory cell. When data is stored as the programming state in the memory cell transistor 12, since electrons are held in the charge storage layer 6, the threshold voltage of the memory cell transistor 12 rises as compared with the initial state (erasure state in which no electrons are held in the charge storage layer 6). That is, since the amount of the current flowing through the selected memory cell transistor 12 changes depending on whether the data stored in the memory cell transistor 12 is "1" representing the programming state or "0" representing the erasure state, it is possible to determine whether or not information is programmed into the memory cell 1 by detecting the amount of the current flowing through the source line SL1.

Figure 7A:
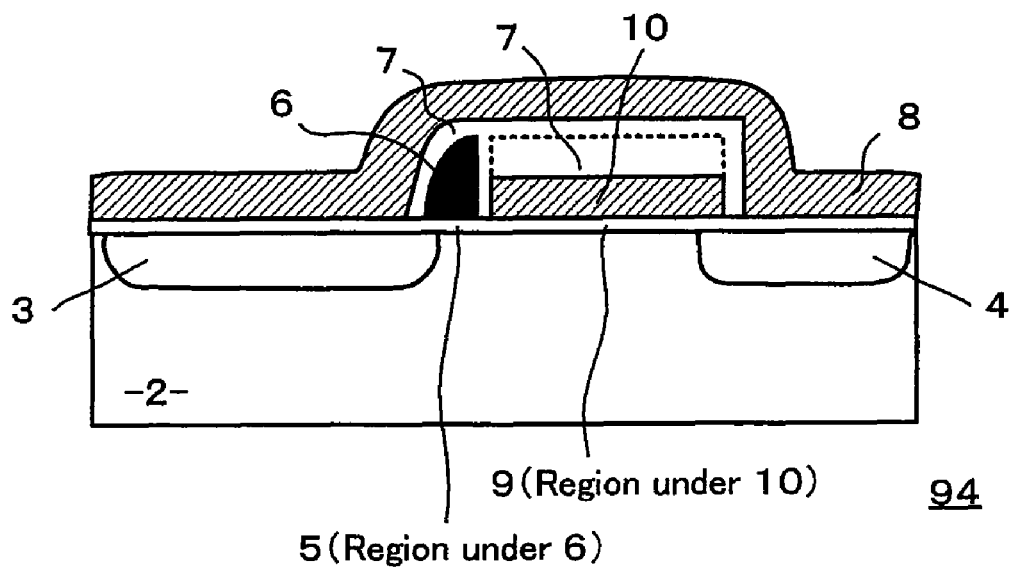
FIGS. 7A and 7B are schematic sectional views of a memory cell of a nonvolatile semiconductor memory device having conventional configuration.
Figure 7B:
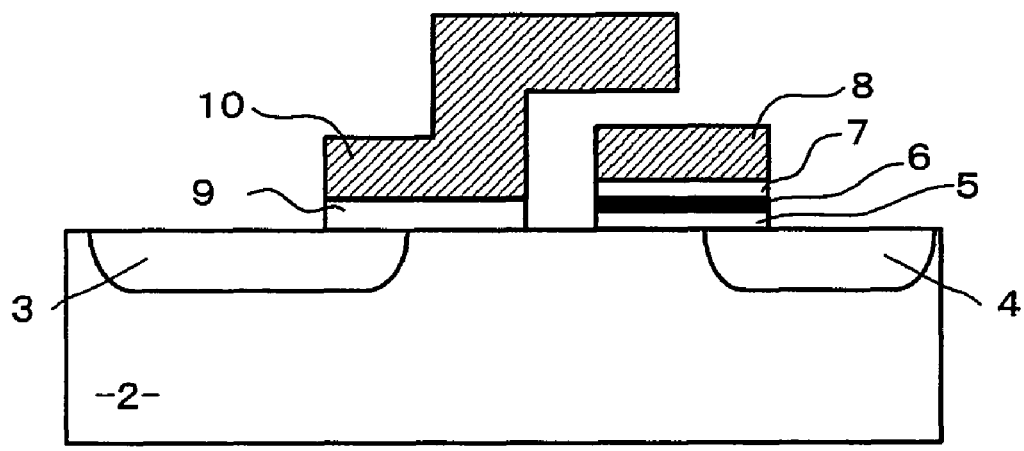

In the device according to the present invention, the impurity density in the third impurity diffusion area 13 formed between the first laminate section 15 and the second laminate section 16 is made low, thereby limiting the movement of electron in the area. Furthermore, by applying voltage to the second gate electrode 10 so as to bring the region under the second laminate section 16 into the weak inversion state, the electric potential at a contact portion between the region under the second laminate section 16 and the third impurity diffusion area 13 gets closer to the ground potential and the potential difference in the third impurity diffusion area 13 is made larger. Thus, the high electrical field occurs in the area, generating hot electrons. Source-side injection of injecting the hot electrons from the source of the memory cell transistor 12 into the charge storage layer 6 is achieved. At this time, as shown in FIG. 2, the configuration of the memory cell 1 according to the present invention is close to the configuration in the conventional known document 1(FIG. 6) in which the access transistor 11 and the memory cell transistor 12 are horizontally arranged. With this configuration, since source-side injection is achieved without the two-layer structure of a part of the gate electrode as in the configuration in conventional known document 3(FIG. 7), a manufacturing process can be simplified. Compared with the device described in the conventional known document 1 which generates channel hot electrons and injects the hot electrons into the charge storage layer, the device according to the present invention which injects electrons into the charge storage layer by source-side injection can lower the programming current and the injection efficiency can be improved by about one digit. That is, compared with the device having the conventional configuration, the device according to the present invention can improve the injection efficiency and simplify the manufacturing process.

As the distance in the channel direction horizontal direction) of the third impurity diffusion area 13 is made smaller, the horizontal electric field in the area becomes larger. Thus, it is preferred that the horizontal distance of the third impurity diffusion area 13 is small. Accordingly, the horizontal distance of the area 13 may be a minimum distance as long as the first gate electrode 8 and the second gate electrode 10 can be processed. When the horizontal distance of the third impurity diffusion area 13 is set to a sufficiently low value of about 100 nm or less, due to the influence of the fringe electric field on the third impurity diffusion area 13 from the side wall of the first gate electrode 8 or the second gate electrode 10 which faces the third impurity diffusion area 13, the electron density in the third impurity diffusion area 13 can be increased. In other words, when the impurity density in the third impurity diffusion area 13 is adjusted in the range of $5 \times 10^{12}/cm^2$ or less so that the net conductive type of active impurity in the area 13 may become N-type, the electron density in the area 13 can be increased due to the above-mentioned fringe electric field from the side surface of the gate electrode and the area 13 serves as a depletion-type parasitic MOS transistor. When the horizontal distance is further decreased, the above-mentioned fringe electric field is increased. Thus, it is preferred to further lower the density in the third impurity diffusion area in order to prevent electric potential drop in the area from being decreased due to the increase in electron concentration. That is, as the horizontal distance of the third impurity diffusion area 13 is made smaller, an optimum value of the impurity diffusion density in the third impurity diffusion area 13 to ensure predetermined voltage drop necessary for generating high electrical field becomes smaller.

When the horizontal distance of the third impurity diffusion area 13 is further decreased and the above-mentioned fringe electric field becomes almost equal to vertical electric field immediately below the gate electrode, even if the net conductive type of active impurity in the area 13 is P-type, the area 13 serves as an enhancement-type parasitic MOS transistor and the electron density in the impurity area 13 can be increased due to the above-mentioned fringe electric field from the side surface of the gate electrode. For this reason, in the range of the above-mentioned sufficiently small horizontal distance, even if the impurity density is lower than the impurity density in the third impurity diffusion area 13 in the case of a long horizontal distance, enough programming current and programming efficiency can be ensured. Accordingly, in this case, the net conductive type of the third impurity diffusion area may be P-type having the polarity opposite to the polarity of the first impurity diffusion area 4 and the second impurity diffusion area 3.

In the graph in FIG. 5, the maximum gate current rises in the range of the impurity density in the third impurity diffusion area 13 of $5 \times 10^{12}/cm^2$ or less. The value is a typical value obtained under standard manufacturing conditions and depends on manufacturing conditions such as the impurity concentration of the P-type impurity doped into the semiconductor substrate 2 and thickness of the first insulating film 5 and the second insulating film 7. However, by setting the impurity density in the third impurity diffusion area 13 to a value which is lower than the impurity density in the first impurity diffusion area 4 and the second impurity diffusion area 3, the maximum gate current which can trap an enough amount of electrons to correctly program information in the charge storage layer 6 can be achieved.

Method According to the Present Invention

Next, a manufacturing method of the memory cell array 21 of the device 20 according to the present invention shown in FIG. 1 will be described. Hereinafter, by using reference numerals in the memory cell 1 shown in FIG. 2 so as not to cause misunderstanding, the method will be described with reference to sectional views according to the manufacturing process shown in FIG. 8A to FIG. 8E.

First, a silicon oxide film (material film of the first insulating film. Hereinafter referred to as a "first insulating film") 5 having a thickness of about 2 to 10 nm is deposited on the semiconductor substrate 2 into which a P-type impurity is doped. Then, a silicon nitride film (material film of the charge storage layer. Hereinafter referred to as a "charge storage layer") 6 having a thickness of about 2 to 20 nm is deposited (Refer to FIG. 8A). After that, the first insulating film 5 and the charge storage layer 6 deposited in areas other than a predetermined area are removed by using the techniques of photolithography and etching (Refer to FIG. 8B). Here, the predetermined area refers to a memory cell transistor formation area (To be exact, a formation area for first laminate section 15) in each memory cell forming the memory cell array 21.

Next, a silicon oxide film (material film of the second insulating film and the third insulating film. Hereinafter referred to as a "second insulating film") 7 having a thickness of about 7 nm, and then, a polysilicon film (material film of the first gate electrode 8 and the second gate electrode 10. Hereinafter referred to as a "gate electrode film") 8 having a thickness of about 50 to 200 nm are deposited. After that, the second insulating film 7 and the gate electrode film 8 deposited in areas other than a predetermined area are removed by using the techniques of photolithography and etching. Here, the predetermined area refers to an area including a memory cell transistor formation area (To be exact, a formation area for first laminate section 15), an access transistor formation area (To be exact, a formation area for second laminate section 16) in each memory cell forming the memory cell array 21, and a transistor formation area in the peripheral circuit area in the periphery of the memory cell array (To be exact, a gate electrode formation area forming the transistor). According to the process, the first laminate section 15 and the second laminate section 16 are formed in each memory cell area (Refer to FIG. 8C).

Figure 8A:
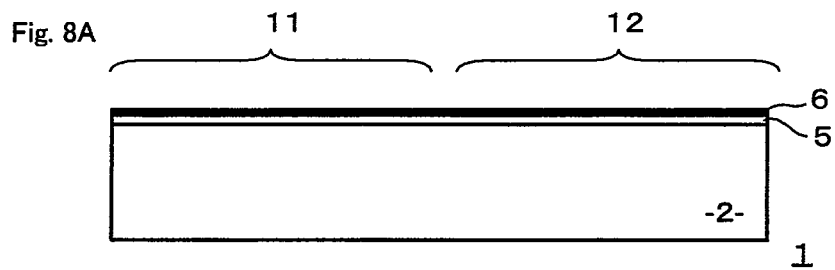
FIGS. 8A to 8E are schematic sectional views of a manufacturing process of the memory cell.
Figure 8B:
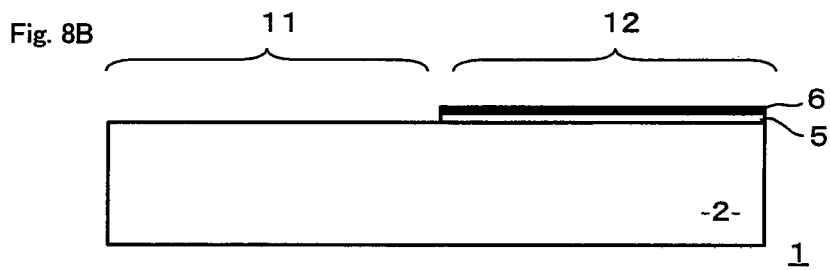
Figure 8C:
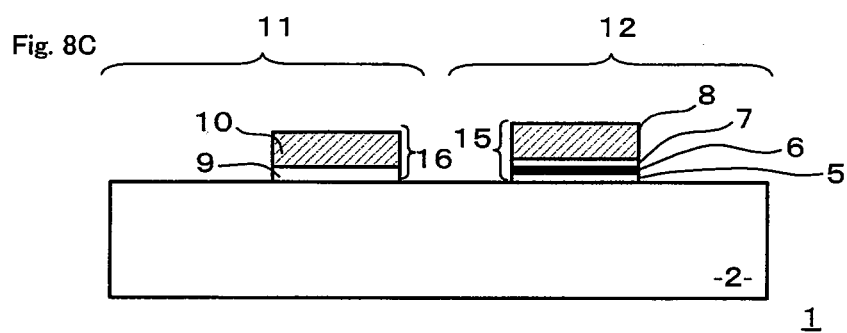
Figure 8D:
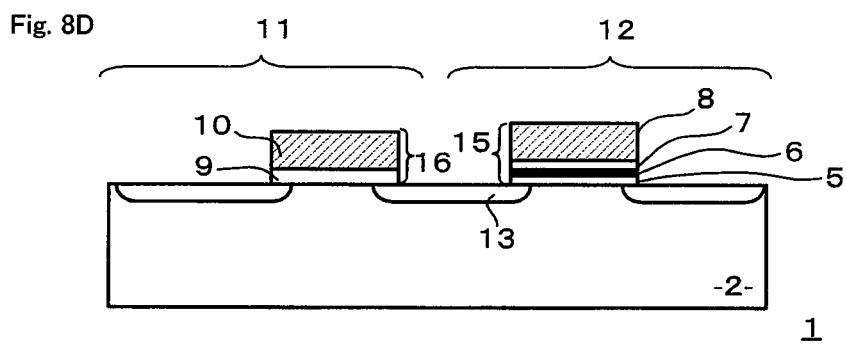
Figure 8E:
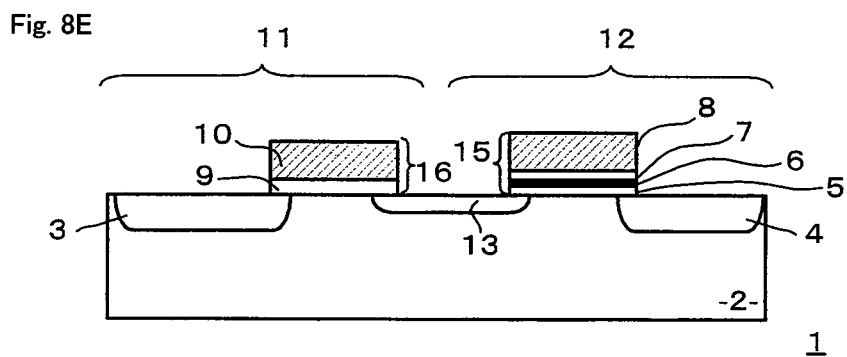

Next, N-type impurity ions are injected into the second impurity diffusion area 3, the first impurity diffusion area 4, the third impurity diffusion area 13 and the transistor diffusion area in the peripheral circuit area on the semiconductor substrate 2 under the condition of low impurity density ($5 \times 10^{12}$ ions/cm$^2$ or less) (hereinafter referred to as a "first injection step") (Refer to FIG. 8D). Then, an upper area of the third impurity diffusion area 13 on the semiconductor substrate 2 is masked and N-type impurity ions are injected into the above-mentioned second impurity diffusion area 3, the first impurity diffusion area 4 and the transistor diffusion area in the peripheral circuit area under the condition of high impurity density ($1 \times 10^{15}$ ions/cm$^2$ or more) (hereinafter referred to as a "second injection step") (Refer to FIG. 8E). After that, the device according to the present invention is manufactured according to conventional steps such as deposition of insulating film, formation of contact and formation of metal wiring.

That is, according to the method of the present invention, since the first gate electrode 8 and the second gate electrode 10 are formed in the same step, the manufacturing process can be shortened compared with the nonvolatile semiconductor memory device having the conventional configuration with a two-layer structure of the gate electrode as described in the known document 3. Furthermore, since the access transistor and the memory cell transistor in the memory cell and the transistor in the peripheral circuit area are simultaneously formed through each step of the deposition of the second insulating film 7, the deposition of the gate electrode film 8 and the injection of N-type impurity ions, the manufacturing process of overall device according to the present invention can be shortened.

The method may include a step of forming a side wall insulating film by introducing the insulating film deposition and processing step between the first injection step and the second injection step to mask the third impurity diffusion area 13 with the side wall insulating film.

Other Embodiments

Hereinafter, other embodiments will be described.

(1) In the above-mentioned embodiment, both the access transistor and the memory cell transistor have the N-channel structure. However, by setting the polarity of the semiconductor substrate 2 and each of the impurity diffusion areas to be opposite to the polarity in the above-mentioned embodiment, P-channel structure can be similarly achieved.

(2) In the above-mentioned embodiment, the silicon nitride film is used as the charge storage layer 6 forming the memory cell transistor 12. However, flash memory structure having a floating gate can be achieved by using a conductive material as the charge storage layer 6.

Although the present invention has been described in terms of the preferred embodiment, it will be appreciated that various modifications and alternations might be made by those skilled in the art without departing from the spirit and scope of the invention. The invention should therefore be measured in terms of the claims which follow.

What is claimed is:

1. A nonvolatile semiconductor memory device comprising:
    a memory cell having second conductive type of first impurity diffusion area and second impurity diffusion area formed on a first conductive type of semiconductor substrate, the memory cell having between the first and second impurity diffusion areas a first laminate section formed by laminating a first insulating film, a charge storage layer, a second insulating film and a first gate electrode in this order from the bottom, and a second laminate section formed by laminating a third insulating film and a second gate electrode in this order from the bottom, wherein
    a third impurity diffusion area sandwiched between the first laminate section and the second laminate section has the second conductive type of impurity density, the impurity density being lower than that of the first and second impurity diffusion areas and not higher than $5 \times 10^{12}$ ions/cm$^2$.

2. The nonvolatile semiconductor memory device according to claim 1, wherein no gate electrode is placed above the third impurity diffusion area.

3. The nonvolatile semiconductor memory device according to claim 1, wherein
    in a first state where several predetermined programming voltages are applied to the first impurity diffusion area, the second impurity diffusion area, the first gate electrode and the second gate electrode respectively, a high electrical field state is formed in the third impurity diffusion area, and charge injection from the third impurity diffusion area into the charge storage layer by source-side injection of hot carriers allows information to be programmed.

4. The nonvolatile semiconductor memory device according to claim 3, wherein a channel of a portion under the second laminate section turns into a weak inversion state in the first state.

5. The nonvolatile semiconductor memory device according to claim 1, wherein the impurity density in the first and second impurity diffusion areas is not lower than $1 \times 10^{15}$ ions/cm$^2$.

6. The nonvolatile semiconductor memory device according to claim 1, wherein the second insulating film and the third insulating film are made of the same insulative material.

7. The nonvolatile semiconductor memory device according to claim 1, wherein the first gate electrode and the second gate electrode are made of the same conductive material.

8. The nonvolatile semiconductor memory device according to claim 1 comprising:
 a memory cell array formed by arranging a plurality of memory cells in row and column directions; and
 a transistor having the same insulative material as the second insulating film, the same conductive material as the first gate electrode and the second conductive type of impurity diffusion area, in a peripheral circuit area other than an area where the memory cell array is formed.

9. A manufacturing method of a nonvolatile semiconductor memory device, the nonvolatile semiconductor memory device being stated in claim 1, the manufacturing method comprising:
 a first step of forming the first insulating film and the charge storage layer in an area where the first laminate section will be formed;
 a second step of sequentially depositing an insulative material and a conductive material after the first step, and forming the first laminate section and the second laminate section by removing both the materials deposited on areas other than a predetermined area;
 a third step of injecting the second conductive type of impurity into the third impurity diffusion area so that the impurity density may be not higher than $5 \times 10^{12}$ ions/cm$^2$ after the second step; and
 a fourth step of injecting the second conductive type of impurity into an area including the first impurity diffusion area and the second impurity diffusion area so that the impurity density may become a predetermined density higher than $5 \times 10^{12}$ ions/cm$^2$.

10. The manufacturing method according to claim 9, wherein the impurity is injected in the third step and the fourth step using the conductive material forming the first laminate section or the second laminate section as a mask.

11. The manufacturing method according to claim 9, wherein the density of the impurity injected in the fourth step is not lower than $1 \times 10^{15}$ ions/cm$^2$.

12. The manufacturing method according to claim 9, wherein
 a control gate electrode of a memory cell transistor for storing information is made of the conductive material of the first laminate section and
 a gate electrode of an access transistor for controlling electrical conduction to the memory cell transistor is made of the conductive material of the second laminate section.

13. The manufacturing method according to claim 9 comprising a step of forming a general-purpose logical circuit on the semiconductor substrate using the conductive material deposited in the second step.

14. The manufacturing method according to claim 9, wherein
 the second step includes depositing the insulative material and the conductive material in a first predetermined area in a peripheral circuit area other than an area where a memory cell array is formed by arranging a plurality of memory cells in row and column directions, and the fourth step includes injecting the second conductive type of impurity into a second predetermined area in the peripheral circuit area to form an impurity diffusion area, so that a transistor having the insulative material, the conductive material and the impurity diffusion area is formed in the peripheral circuit area.

15. A method of programming information into a nonvolatile semiconductor memory device, the nonvolatile semiconductor memory device being stated in claim 1, the method comprising:
 programming information by applying several predetermined programming voltages to the first impurity diffusion area, the second impurity diffusion area, the first gate electrode and the second gate electrode, respectively, wherein
 a voltage applied to the second gate electrode is close to a threshold voltage of a channel of a portion under the second laminate section.

* * * * *